United States Patent [19]
Smith

[11] Patent Number: 4,894,527
[45] Date of Patent: Jan. 16, 1990

[54] LIGHT DEPENDENT RESISTOR DIGITAL CONTROL CIRCUIT

[75] Inventor: Edgar M. Smith, Millersville, Pa.

[73] Assignee: Burle Technologies, Inc., Lancaster, Pa.

[21] Appl. No.: 324,677

[22] Filed: Mar. 17, 1989

[51] Int. Cl.$^4$ .............................................. H01J 40/14
[52] U.S. Cl. .............................. 250/214 AL; 250/221
[58] Field of Search ................. 250/214 AL, 214 DC, 250/214 R, 221, 222.1; 340/555, 567

[56] References Cited

U.S. PATENT DOCUMENTS

| | | | |
|---|---|---|---|
| 4,514,727 | 4/1985 | Van Antwerp | 250/214 AL |
| 4,644,149 | 2/1987 | Tsunekawa | 250/214 AL |
| 4,768,020 | 8/1988 | Chen | 250/214 AL |
| 4,847,486 | 7/1989 | Moran et al. | 250/221 |

Primary Examiner—David C. Nelms
Assistant Examiner—Khaled Shami
Attorney, Agent, or Firm—Martin Fruitman

[57] ABSTRACT

A digitally controlled ambient light detection circuit for an infrared intrusion detector. A light dependent resistor is used as a charging circuit for pulse driven capacitor on the input of a digital buffer circuit so that the time of reaching the threshold voltage of the buffer varys with the light falling on the light dependent resistor. The buffer output is then compared to a reference pulse which is synchronized with, but delayed from, the capacitor charging pulse. If the buffer output occurs after the reference pulse it indicates low light, and an output signal is generated to activate the infrared intrusion detector.

3 Claims, 1 Drawing Sheet

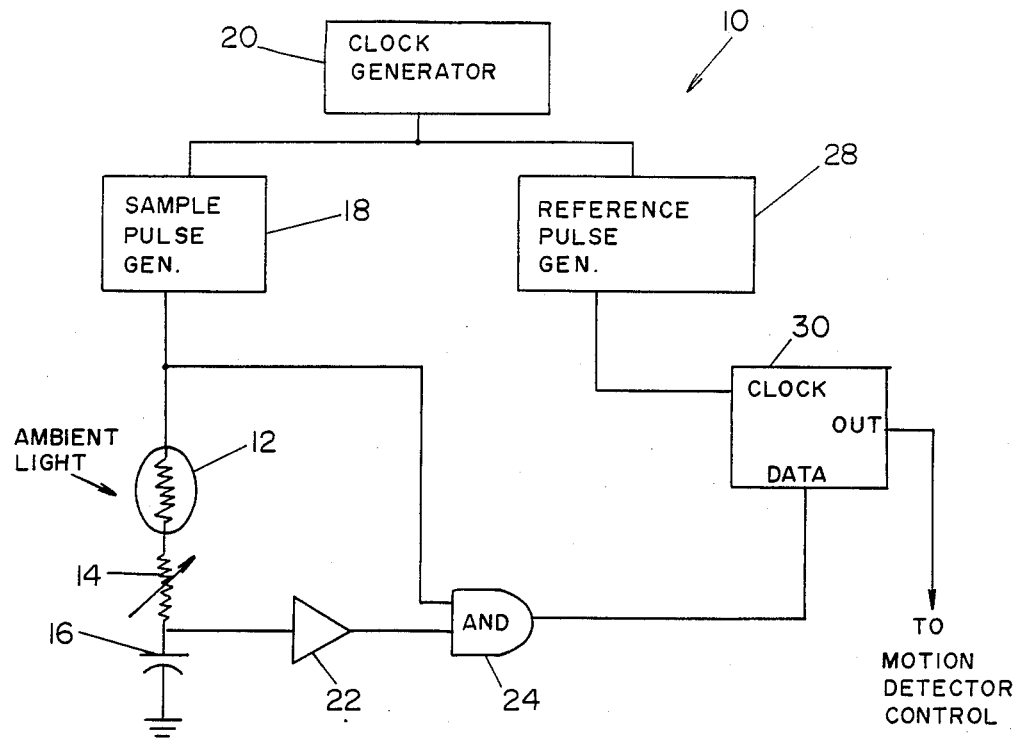

LIGHT DEPENDENT RESISTOR DIGITAL CONTROL CIRCUIT

SUMMARY OF THE DISCLOSURE

This patent deals generally with light detection and more specifically with a circuit which responds to an ambient light level to activate an appropriate signal to activate a digital control circuit.

Intruder detection circuits have become common household items. So much so that they are even used in situations which would not be considered "intrusions". The systems have become so commonplace and have been made so compact that they can now be used to replace common, everyday wall switches for the control of household lights.

In such situations, room or yard lights can be turned on, not only when some unwanted intruder activates the system, but also when residents merely walk through an area, thus automatically furnishing light only when it is needed, and turning the lights off automatically after a specific time period when no person's presence is detected.

However, this very increase in use brings greater demands for reliability and improved suppression of noise signals. When each household has several such intrusion detectors everyone expects those lights to go on only when they are supposed to, and every time they are required to, and no one will tolerate the television picture being interfered with every time the kitchen lights go on.

Yet many existing detector circuits have just such problems. Sensitivity adjustments can be difficult to set and may vary with room temperature, and radio frequency interference can make the use of radios and television difficult in the proximity of a detector. The present invention improves these situations by using digital control technology.

By using digital control technology rather than analog circuitry, the present invention furnishes a highly sensitive but easily adjustable circuit. However, this involves converting the essentially analog signals from light sensitive devices into digital signals, and one place that this conversion is required is in ambient light detecting circuits.

Monitoring ambient light is a necessity in most intrusion detection systems for two basic reasons. First, activating lights to discourage intrusion or as a convenience in an already lighted area is clearly ineffective. Moreover, the existence of ambient light in an area frequently suggests the presence of incidental infrared sources, such as incandescent lamps or sunlight, which may generate false signals for an infrared detector if it is not disabled.

The present invention therefore senses the presence of ambient light and, although using an analog signal generating light dependent resistor, generates a digital signal which can be used to disable a digital infrared detector circuit when the ambient light is above a preselected level.

This is accomplished by using a clock synchronized sample pulse to charge a capacitor through the light dependent resistor in series with a user adjustable potentiometer. The voltage on the capacitor is applied to the input of a digital buffer which produces an output pulse when its specific threshold voltage is reached as the capacitor charges. The buffer output is then digitally compared to a reference signal which is synchronized with but begins after the capacitor charging pulse.

The comparator circuit then generates a disable signal for the following infrared detector circuit if the capacitor initiated signal occurs before the reference signal, indicating low resistance for the light dependent resistor and therefore indicating the presence of ambient light.

In the preferred embodiment of the present invention, the charging pulse and the reference pulse repeat at an 8Hz rate so that the ambient light condition is sampled 8 times each second.

The present invention therefore converts the analog light signal into a digital control and does so with very low power consumption, since the light controlled resistor is not operated continuously but only pulsed. In the preferred embodiment of the invention the capacitor is charged with a pulse of only approximately 4 milliseconds and the duty factor is therefore only 0.032, which greatly limits power consumption.

BRIEF DESCRIPTION OF THE DRAWING

The FIGURE is a simplified diagram of the circuit of the preferred embodiment.

DETAILED DESCRIPTION OF THE INVENTION

The preferred embodiment of the invention is shown in the FIGURE in which digital ambient light detector circuit 10 converts the light level seen by light dependent resistor 12 to a digital output signal which is fed to a digital motion detector control circuit (not shown) in order to disable the operation of an associated infrared motion detector when the ambient light level is too high to permit operation of the motion detector.

Light dependent resistor 12 can best be considered a simple resistor whose resistance decreases with increased light and increases with decreased light. In the preferred embodiment light dependent resistor 12 is connected in series with variable resistor 14 and together they form a charging resistor for capacitor 16 with which they are connected in series.

The charging voltage for capacitor 16 is supplied by sample pulse generator 18 which generates a rectangular pulse and is itself driven by digital clock generator 20. In the preferred embodiment, sample pulse generator 18 operates at an 8 Hz pulse repetition rate and produces a rectangular pulse of approximately 4 milliseconds length.

The sample pulse charges capacitor 16 at varying rates depending upon the setting of variable resistor 14 and the resistence of light dependent resistor 12 which depends upon the light affecting it. Since the same charging voltage is applied at the beginning of every pulse from sample pulse generator 18, the time at which the higher voltage terminal of capacitor 16 will reach a particular voltage level will vary depending upon the resistance of light dependent resistor 12 and therefore upon the ambient light level.

Logic buffer circuit 22 is the means of determining the rate of charge of capacitor 16. Since it has a fixed threshold voltage level at which it will generate an output signal, the timing of its output signal indicates the time at which capacitor 16 has reached a particular voltage. As is apparent from the previous discussion, the higher the ambient light is, the lower the total charging resistor will be and the sooner after the initiation of the sample pulse there will be an output signal from buffer circuit 22.

This output signal from buffer circuit 22 is fed to one input of AND gate 24 while the other input is connected to the output of sample pulse generator 18. This assures that the signal from buffer circuit 22 must be simultaneous with the output of sample pulse generator 18, and thus furnishes protection against incidental noise signals during the period when sample pulse generator 18 is off.

The output of AND gate 24 is then fed to the data input of logic circuit 30.

Reference pulse generator 28 is driven by clock generator 20 and is therefore synchronous with sample pulse generator 18. However, reference pulse generator 28 is delayed relative to sample pulse generator 18 and its pulse starts after that of sample pulse generator 18. In the preferred embodiment of the invention the reference pulse generator output starts approximately 2 milliseconds after the sample pulse generator output.

In operation, adjustable resistor 14 is adjusted by the user so that at a particular ambient light level the charge time of capacitor 16 is the same as the time delay between the sample pulse generator output and the reference pulse generator output.

For example, a user might set adjustable resistor 14 at dusk so that the infrared motion detector controlled by ambient light detector circuit 10 is disabled at that level of light. Then, as ambient light decreases as night falls, circuit 10 will activate the motion detector it controls.

Ambient light detector circuit 10 compares the signal resulting from the charging of capacitor 16 with the output of reference generator 28 by means of logic circuit 30. The output of reference signal generator 28 is connected to the clock input of logic circuit 30, while the output of AND gate 24 is connected to the data input of logic circuit 30.

Logic circuit 30 is interconnected with the following infrared detector control circuit so that a low output voltage from logic circuit 30 permits the motion detector circuit to operate, while a high output voltage from logic circuit 30 disables the motion detector circuit. Moreover, logic circuit 30 operates so that it produces a low output if its clock input precedes its data input, while it produces a high output when the date input precedes the clock. Thus, the only condition upon which the motion detector is permitted to operate is when the clock input to logic circuit 30 comes earlier than the data input.

Therefore, when the capacitor originated signal is earlier than the reference pulse, meaning there is high ambient light, AND gate 24 generates a signal on the data input of logic circuit 30. However, with no clock input from reference pulse generator 28, logic circuit 30 disables the following motion detector.

However, when the reference pulse generator output signal precedes the signal from AND gate 24, meaning the ambient light level is low, then the reference pulse is applied to the clock of logic circuit 30 early and the following motion detector circuit is permitted to operate.

The present invention therefore fulfills the requirement of converting the ambient light level signal to a digital control signal and, moreover, repeatedly samples the condition of ambient light so that no significant time delay occurs between a change of ambient light and the circuit response.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims. For instance, variable resistor 14 could be omitted or could be connected in some other location in series with light dependent resistor 12.

What is claimed as new and for which Letters Patent of the United States are desired to be secured is:

1. A digital ambient light level detector circuit which changes its output signal as an ambient light level passes through a preselected value comprising:
    a light dependent resistor with a first terminal and a second terminal;
    a capacitor with a higher voltage terminal interconnected with the first terminal of the light dependent resistor, the capacitor also interconnected with a circuit return;
    a sample pulse generator generating a pulse voltage, its output interconnected with and applying the pulse voltage to the series circuit of the light dependent resistor and the capacitor, the pulse voltage being of such amplitude and duration to significantly charge the capacitor;
    a logic buffer circuit connected to the higher voltage terminal of the capacitor and having an input and an output, the logic buffer circuit generating a signal on its output when a specific threshold voltage is applied to its input;
    a reference pulse generator synchronized with the sample pulse generator and generating a pulse voltage on its output which begins after the pulse voltage generated by the sample pulse generator; and
    a logic circuit with a clock input, a data input and an output, one signal being generated on the output only when its clock input signal precedes its data input signal, and another signal being generated on the output at all other conditions, the data input being interconnected with the output of the logic buffer circuit and the clock input being connected to the output of the reference pulse generator, and the output of the logic circuit serving as the output of the ambient light level detector circuit.

2. The digital circuit of claim 1 further including an AND logic circuit, with two inputs and an output, which serves to interconnect the logic buffer circuit and the logic circuit, a first input of the AND logic circuit being connected to the output of the logic buffer circuit, a second input of the AND logic circuit being connected to the output of the sample pulse generator and the output of the AND logic circuit being connected to the data input of the logic circuit.

3. The digital circuit of claim 1 further including a variable resistor which is connected in series with the light dependent resistor.

* * * * *